United States Patent [19]
Berkcan

[11] Patent Number: 5,461,307
[45] Date of Patent: Oct. 24, 1995

[54] ELECTRO-OPTICAL CURRENT SENSING SYSTEM AND METHOD FOR SENSING AND AVOIDING THERMALLY INDUCED MEASUREMENT ERROR THEREIN

[75] Inventor: Ertugrul Berkcan, Schenectady, N.Y.

[73] Assignee: General Electric Company, Schenectady, N.Y.

[21] Appl. No.: 205,220

[22] Filed: Mar. 3, 1994

[51] Int. Cl.⁶ .................................................. G01R 1/44
[52] U.S. Cl. ........................... 324/105; 324/96; 324/126; 324/117 R
[58] Field of Search ......................... 324/96, 126, 117 R, 324/127, 105; 374/178, 161, 163, 117

[56] References Cited

U.S. PATENT DOCUMENTS

| | | | |
|---|---|---|---|
| 4,021,722 | 5/1977 | Crowle | 374/178 |
| 4,492,919 | 1/1985 | Milkovic | 324/127 |
| 4,576,485 | 3/1986 | Lambert | 374/161 |
| 4,848,923 | 7/1989 | Ziegler et al. | 374/178 |
| 4,933,629 | 6/1990 | Kozuka et al. | 324/96 |
| 4,967,144 | 10/1990 | Aoshima et al. | 324/96 |
| 5,024,535 | 6/1991 | Winston, Jr. | 374/178 |
| 5,113,131 | 5/1992 | Cooper et al. | 324/96 |

*Primary Examiner*—Kenneth A. Wieder
*Assistant Examiner*—Kourosh Cyrus Khosravi
*Attorney, Agent, or Firm*—Enrique J. Mora; Marvin Snyder

[57] ABSTRACT

An electro-optics current sensing system for sensing and avoiding thermally induced measurement errors in a current sensor includes a beam generator, such as a light emitting diode or a laser diode, thermally coupled to the current sensor for encoding into the optical beam supplied by the beam generator both temperature and sensed current information. An electro-optics (E/O) demodulator which includes a wavelength division multiplexer (WDM) demodulates the encoded optical beam to recover the temperature and sensed current information from a pair of demodulated signals which can be further processed for filtering resistivity changes from the sensed current measurement.

22 Claims, 4 Drawing Sheets

ELECTRO-OPTICAL CURRENT SENSING SYSTEM AND METHOD FOR SENSING AND AVOIDING THERMALLY INDUCED MEASUREMENT ERROR THEREIN

RELATED APPLICATIONS

This application is related to allowed patent application Ser. No. 08/085,787, (RD-22,251) entitled "Noninductive Shunt Current Sensor," by E. Berkcan, filed Jul. 6, 1993, assigned to the assignee of the present invention and herein incorporated by reference.

1. Field of the Invention

The present invention is generally related to electro-optical current sensing systems and, in particular, to an electro-optical system for sensing and avoiding thermally induced measurement errors in a current sensor.

2. Background of the Invention

State of the art current sensors typically suffer from thermally induced changes, such as resistivity changes, which can affect the accuracy of a current measurement obtained. The above-cited patent application, in part, describes a temperature detection approach using a temperature measurement from a thermistor. Both the temperature and current measurements are transferred through respective separate circuits to an electro-optic interface and then to a digital signal processing (DSP) circuitry which is at a line voltage substantially lower than the typical line voltage generally encountered in many metering or electrical power tripping applications. Although such approach is advantageously employed to reduce temperature as a source of error for the current measurement obtained, it is desirable to modulate into a single signal both the current and temperature measurements thus reducing the number of components required to carry such measurements and thus lowering the cost and improving the reliability and speed of operation associated with such temperature detection technique. Additionally, being that the nonlinearity characteristics of a thermistor, in general, add to the processing complexity required for filtering any temperature dependence of the current sensor, it is further desirable to provide a temperature detection technique which is not burdened by such nonlinearity characteristics.

SUMMARY OF THE INVENTION

Generally speaking, the present invention fulfills the foregoing needs by providing an electro-optics system which can be used for sensing signal and avoiding changes due to thermally induced changes in a current sensor. The system includes means for digitizing a signal indicative of sensed current to supply a corresponding binary coded signal. Means, such as a driver circuit, is coupled to the digitizing means for producing excitation pulses corresponding to a respective digital value of the binary coded signal. A beam generator, such as a light emitting diode or a laser diode and the like, generates an optical beam having its amplitude modulated in response to the excitation pulses such that the modulation is indicative of the sensed current. The beam generator is thermally coupled to at least one of a conductive element pair of the current sensor so that a center wavelength of the generated optical beam is predeterminedly shifted in response to the temperature of the one conductive element. An electro-optics demodulator is optically coupled to the beam generator to receive the optical beam so as to demodulate the received optical beam into a respective pair of demodulated signals for measuring the sensed current and the temperature of the one conductive element.

A method of operating an electro-optical current sensing system in accordance with the present invention includes the steps of converting the signal indicative of sensed current into a corresponding binary coded signal; producing excitation pulses corresponding to a respective digital value of the binary coded signal; applying the excitation pulses to an optical beam generator to generate an optical beam having its amplitude modulated in response to the excitation pulses, the beam generator being thermally coupled to at least one of a conductive element pair of the current sensor so that a center wavelength of the generated optical beam is predeterminedly shifted in response to the temperature of the one conductive element; and demodulating the optical beam into a respective pair of demodulated signals for measuring the sensed current and the temperature of the one conductive element. Additional steps of converting the temperature measurement to a resistivity measurement, and filtering any change in resistivity due to temperature from the sensed current measurement effectively allow for removing thermally induced errors from the sensed current measurement.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like numbers represent like parts throughout the drawings, and in which:

DETAILED DESCRIPTION OF THE INVENTION

Figure 1A:
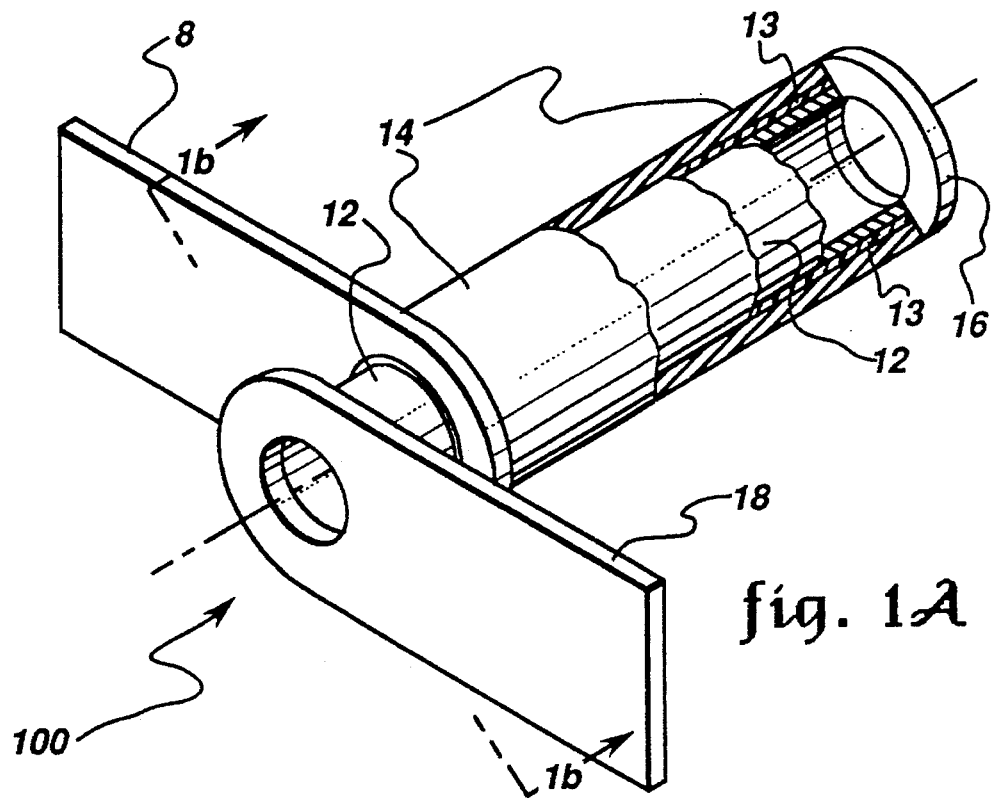
FIG. 1a is an isometric, partially cut-away view of an exemplary current sensor which can advantageously be used in the present invention.
Figure 1B:
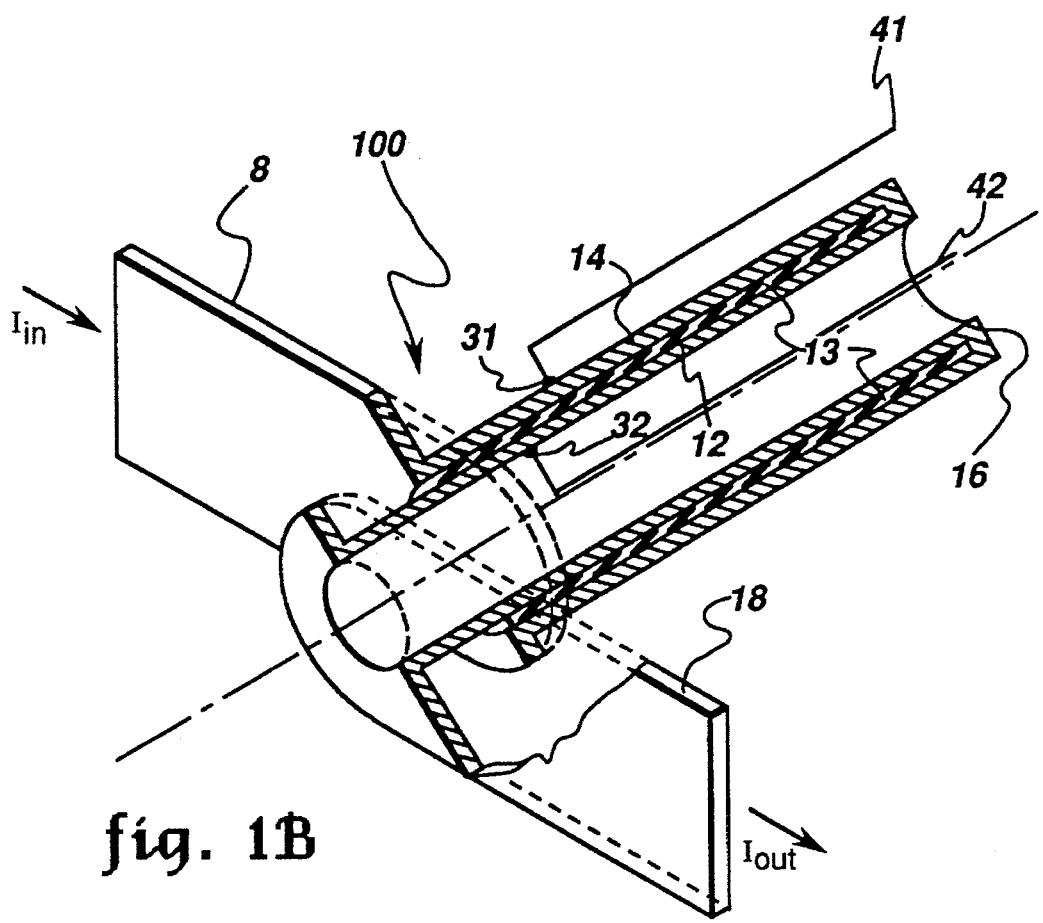
FIG. 1b is an isometric, cross-sectional view of the current sensor of FIG. 1a, taken through a plane including the major axis of the conductive cylindrical elements of the current sensor.

FIGS. 1a and 1b illustrate one exemplary current sensor, such as a noninductive shunt current sensor 100, which can conveniently utilize the present invention. The exemplary current sensor illustrated therein utilizes a measurement of voltage for assessing the value of the current. The input current, $I_{in}$, is carried by a conductor 8, such as a conductive plate, to a pair of nested concentric conductive elements, such as pipes or hollow cylinders, cylinder 12 being the inner cylinder and cylinder 14 being the outer cylinder. The conductive cylinders are connected by a conductive end-piece or washer 16. Except for end-piece 16, an insulating material, such as an air gap or other insulation 13, such as Kapton® polyamide available from E. I., dupont deNemours and Company, Wilmington, Del., isolates the surfaces of the two cylinders or pipes physically and electrically. Thus, a series-connected path for current flow through both cylinders is thereby established which allows the output current Iout, to leave the concentric pipes or cylinders by conductor 18. The respective lengths of the conductive elements 12 and 14 may be selected to realize a predetermined resistance that is desired between selected detection or contact points, such as contact point pair 31-32. The parameter to be sensed, current, is based on the voltage drop or voltage difference across the lead pair 41-42. The choice of the material to use in fabricating a current sensor may depend on the resistivity of the material as well as its cost.

Figure 2:
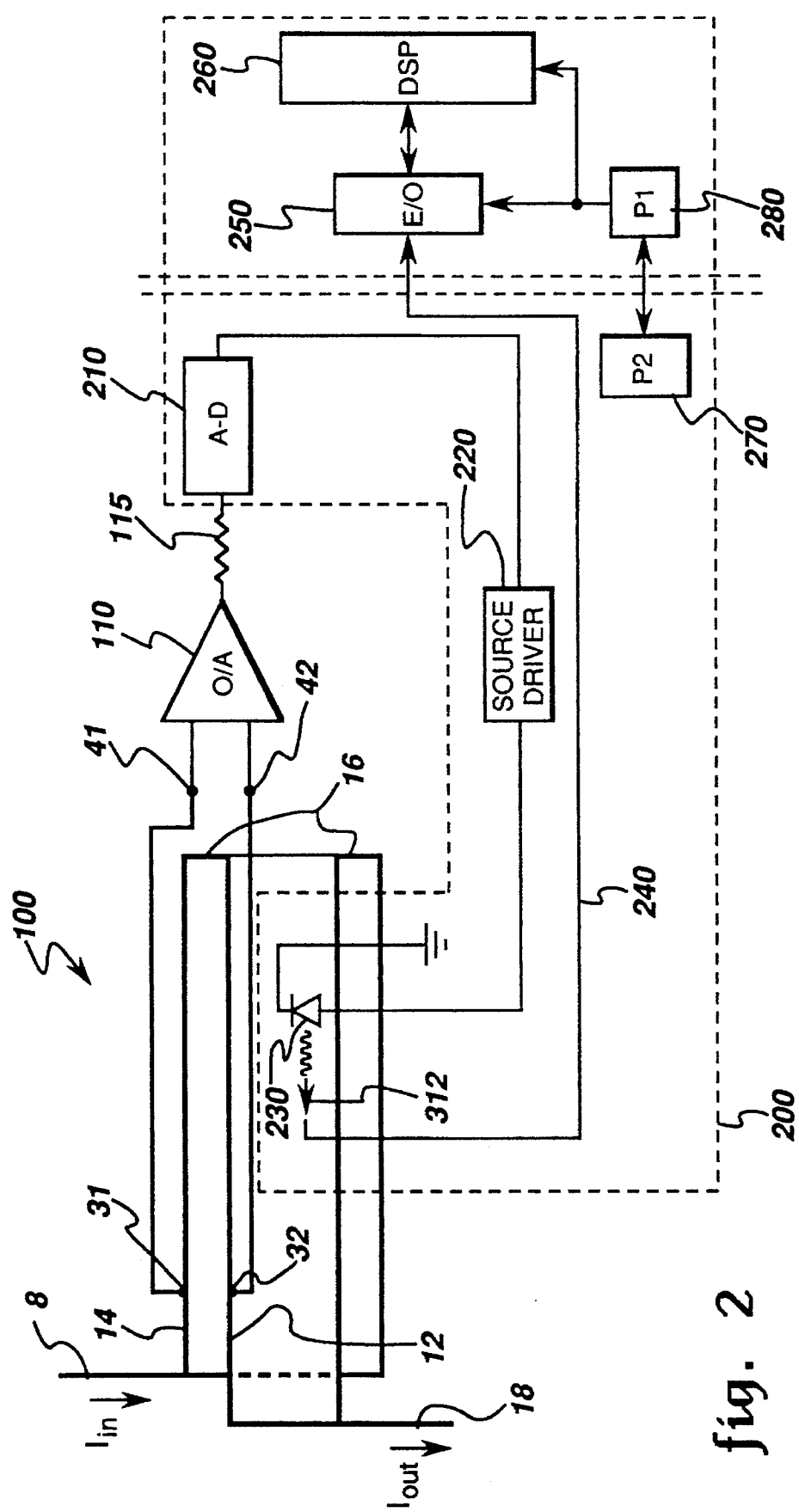
FIG. 2 shows in part a schematic diagram of an electro-optical system in accordance with the present invention with a beam generator thermally coupled to the current sensor.

FIG. 2 illustrates an electro-optical system 200 in accordance with the present invention that can be employed during operation of the current sensor as described hereinafter to produce an output signal that is essentially unaffected by variations in sensor material resistivity due to variations in temperature of the sensor material. Conventional front end signal conditioning of the signal voltage supplied by the current sensor can be first accomplished with an an operational amplifier (O/A) 110, which detects the voltage across conductors 41-42, for example, and provides an initial amplification, if desired. The output signal of the operational amplifier is an analog signal indicative of sensed current after suitable scaling by a resistance 115.

The electro-optical system of the present invention includes an analog-to-digital (A/D) converter 210 for digitizing the signal indicative of sensed current to supply a corresponding binary coded signal. Means, such as a driver circuit 220, is coupled to A/D converter 210 for producing excitation pulses corresponding to a respective digital value of the binary coded signal. For example, each respective excitation pulse can conveniently correspond to a respective digital "one" in the binary coded signal. An optical beam generator 230, such as a light emitting diode (LED) or a laser diode, generates an optical beam 312 having its amplitude modulated in response to the excitation pulses from driver circuit 220 in a manner that such modulation is indicative of the sensed current measurement. For example, the amplitude of the optical beam can be conveniently modulated in response to the excitation pulses such that the digital "one" corresponds to the beam generator being "on" and a digital "zero" corresponds to the beam generator being "off".

A key advantage of the present invention is achieved when beam generator 230 is thermally coupled to the current sensor. This thermal coupling, as will be explained shortly hereafter, allows for encoding a temperature measurement into the optical beam produced by the beam generator and thus such optical beam advantageously carries information for both the current and the temperature measurements. This is significant because such temperature detection technique avoids having to use respective separate circuits for the temperature and current measurements. By way of example, beam generator 230 can be thermally coupled to at least one of cylindrical element pair 12 and 14 so that a center wavelength of the optical beam is predeterminedly shifted in response to the temperature of the one conductive element in thermal contact with the beam generator.

Figure 3:
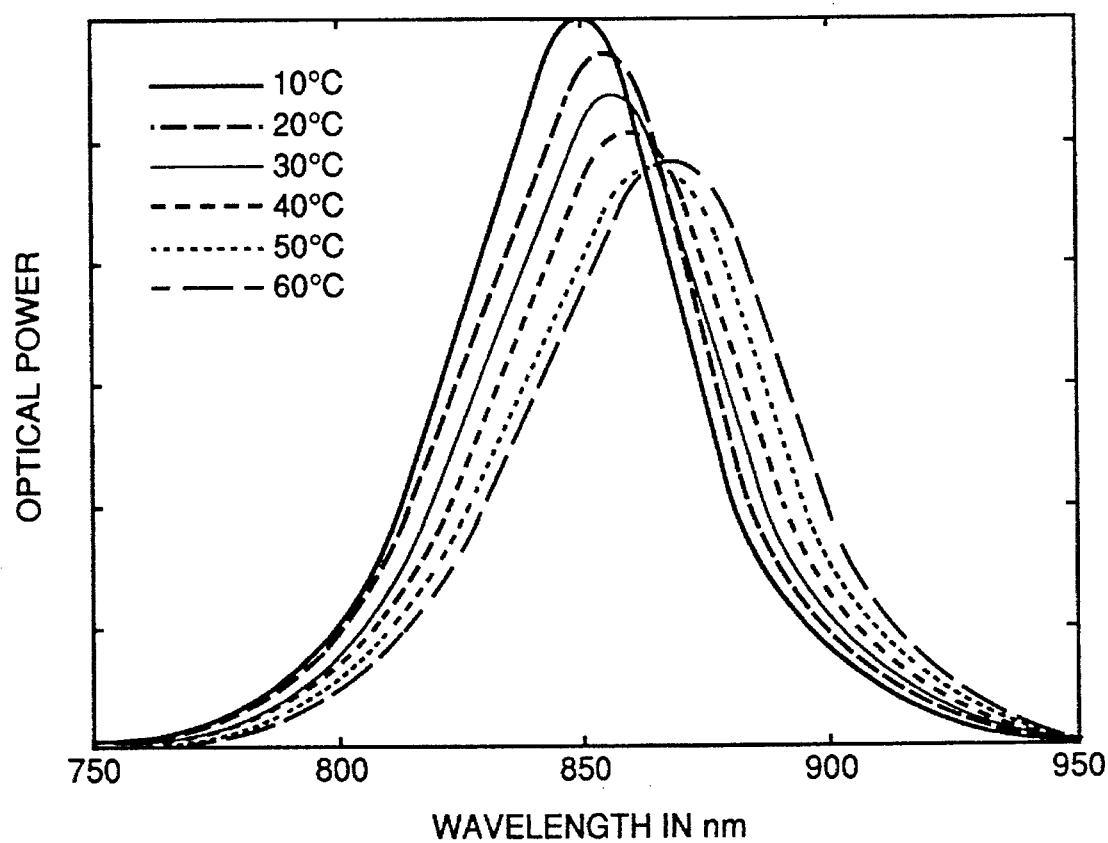
FIG. 3 illustrates an exemplary spectral response as a function of temperature of the beam generator of FIG. 2.

FIG. 3 illustrates an exemplary emission spectrum of a typical optical beam generator used in the present invention. For example, over a temperature range of 10° C.–60° C. the average value for the shift of the center wavelength was measured to be about 0.32 nm/°C. As previously suggested, such characteristic is utilized to encode the temperature measurement into the optical beam produced by the beam generator. It can be further observed from FIG. 3 that the power of the optical beam produced by beam generator 230 can change as much as 0.3%/°C. This temperature dependent power variation, however, does not affect accuracy of the amplitude modulation for encoding the sensed current information, being that the digital encoding imparted by the driver circuit in cooperation with the A/D converter effectively filters out such temperature dependent power variation. This is because so long as detection of a digital "one" and a digital "zero" is achieved, the power variation due to temperature change simply cannot affect the aforementioned modulation technique for carrying the sensed current information.

Returning to FIG. 2, the beam produced by beam generator 230 can then be transferred by way of a suitable fiber optic 240 to an electro-optics (E/O) demodulator 250 which is coupled to digital signal processing (DSP) circuitry 260. As represented by the dashed-line pair, E/O demodulator 250 and DSP circuitry 260 are not at the line potential, thus providing satisfactory isolation to enhance safety. The DSP circuitry is employed to perform filtering and further signal conditioning, such as to remove the temperature dependence of the resistivity from the temperature measurement carried on the optical beam provided by beam generator 230 and/or to remove the effects of higher order harmonics. Consistent with an embodiment providing line voltage isolation, power to the E/O demodulator and the DSP circuitry may be supplied either through a power optical interface or through magnetic coupling, such as provided between power supplies (P2) 270 and (P1) 280. Likewise, isolated power supplies (not shown) may be employed instead of the above power transfer process.

Figure 4A:
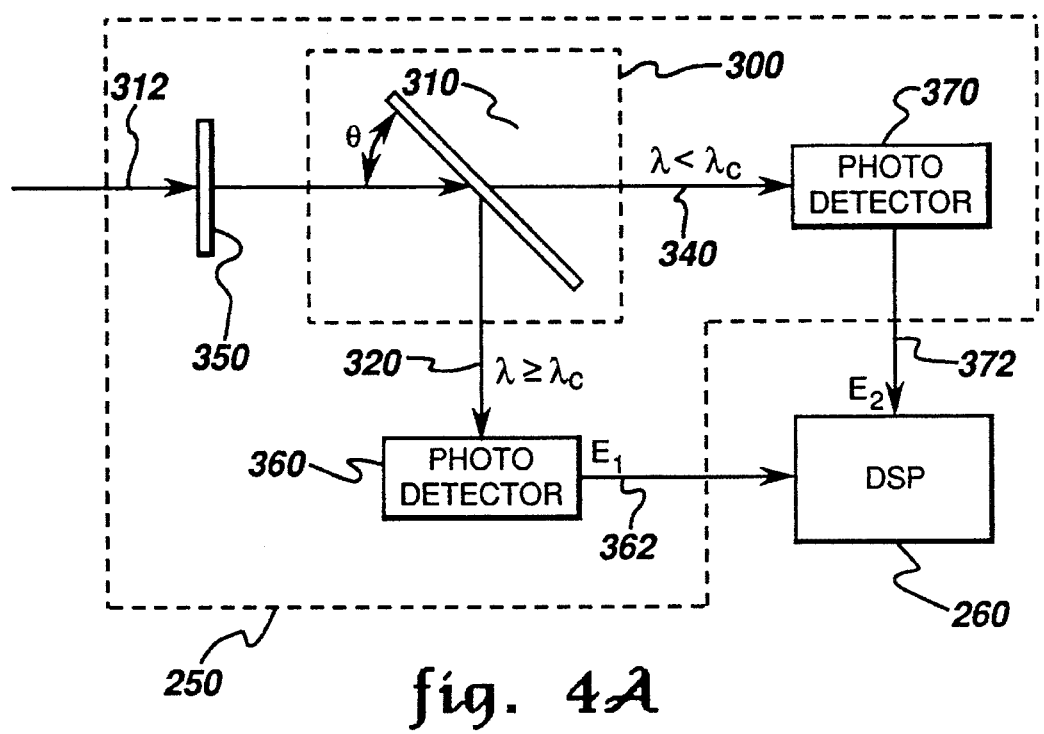
FIGS. 4A and 4B illustrate, in block diagram form, respective exemplary embodiments of an electro-optics demodulator, part of the electro-optical system of the present invention.
Figure 4B:
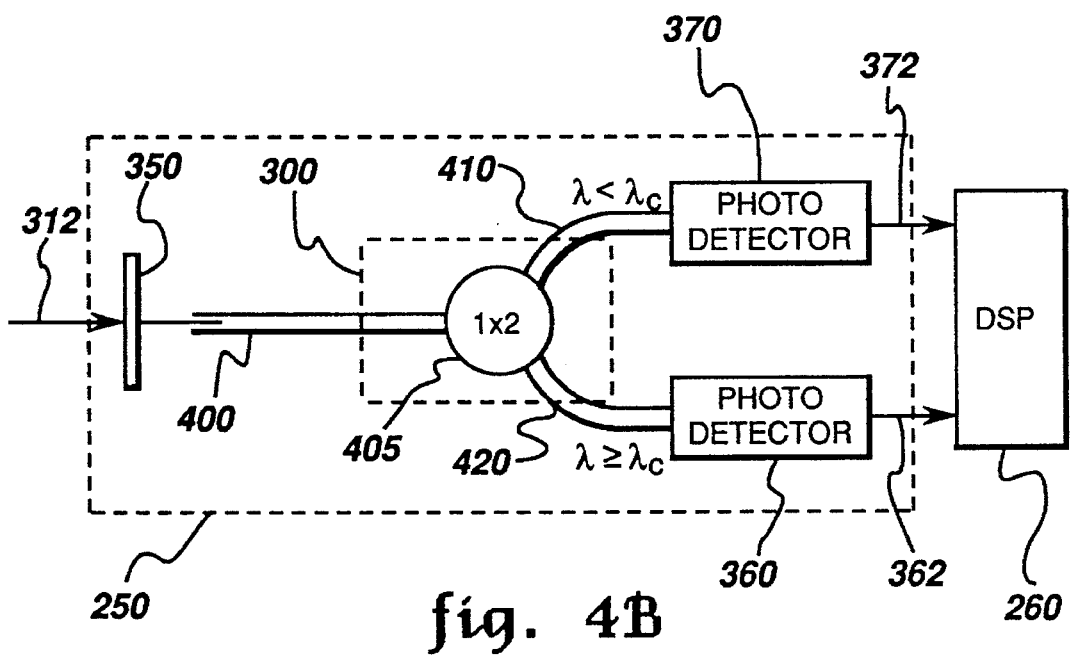

FIGS. 4A and 4B illustrate respective exemplary embodiments for E/O modulator 250 which is used to demodulate optical beam 312 provided by beam generator 230 (FIG. 2) so as to recover the temperature and sensed current information encoded therein. E/O demodulator 250 can include a commercially available wavelength division multiplexer (WDM) 300 having a predetermined cutoff wavelength ($\lambda_c$) for operating on the received optical beam. A compensation optics such as an optical filter 350 can be situated, if desired, between beam generator 230 (FIG. 2) and WDM 300 to filter predetermined spectral components of the optical beam passing therethrough so as to improve the detection capability of the E/O demodulator. WDM 300, as illustrated in FIG. 4A, includes a dichroic filter 310 positioned at a predetermined angle θ with respect to beam 312. In operation dichroic filter 310 selectively splits optical beam 312 into a demodulated constituent beam pair emerging from WDM 300 along a respective one of first and second output axes 320 and 340 in accordance with the center wavelength shift experienced by the optical beam with respect to the cutoff wavelength. By way of example and not of limitation, the constituent beam (designated as ($\lambda \geq \lambda_c$)) whose spectral components are greater than or equal to the cutoff wavelength may be supplied along the first output axis 320 while the constituent beam (designated as ($\lambda < \lambda_c$)) whose spectral components are less than the cutoff wavelength may be supplied along the second output axis 340. First and second photodetectors 360 and 370 are positioned along the first and second output axes, respectively, to receive the constituent beam pair to produce a corresponding pair of electrical signals $E_1$ and $E_2$ which are passed by way of electrical leads 362 and 372, respectively, to DSP 260 for suitable signal conditioning. It can be shown that the signal ratio $\rho = E_2/E_1$ corresponds to the temperature measurement whereas the power content of either of the individual signals $E_2$ or $E_1$ is indicative of the sensed current. It can be further shown that such ratiometric measurement technique exhibits substantially linear characteristics over the desired temperature range, thus avoiding the disadvantages associated with the nonlinearities of a thermistor. For further background on ratiometric measurement techniques used in optical temperature compensation, see for example, U.S. patent application Ser. No. 08/118,467 (RD-21991) by E. Berkcan, filed Sep. 8, 1993, assigned to the assignee of the present invention and herein incorporated by reference.

Different kinds of WDMs can be employed depending on any desired implementation; for example, the WDM of FIG. 4A can be conveniently used in a "free-space" optical coupling implementation, while the embodiment illustrated in FIG. 4b illustrates a WDM such as WDM model no. WD813-D1, available from JDS Siten, Inc., which can be conveniently used in an implementation using respective optical ports (e.g., input port 400 and output ports 410 and 420) to provide suitable optical coupling and which can be integral to the WDM. For example, the WDM illustrated in FIG. 4B includes an optical waveguide device 405 designed to have the cutoff wavelength discussed in the context of FIG. 4a so as to provide through output ports 410 and 420 the constituent beam pair to the photodetector pair. For more background on wavelength division multiplexing, see pp. 890–892 of *Fundamental of Photonics*, 1991, by B. E. A. Saleh and M. C. Teich, available from John Wiley and Sons, Inc., which is herein incorporated by reference.

An electro-optical system in accordance with the present invention can thus be employed for sensing thermally induced changes in a voltage signal indicative of current sensed with a current sensor having a pair of conductive elements. The signal indicative of sensed current is converted into a corresponding binary coded signal. Excitation pulses are then produced corresponding to a respective digital value of the binary coded signal. The excitation pulses are then applied to an optical beam generator 230 (FIG. 2) to generate an optical beam having its amplitude modulated in response to the excitation pulses. As previously stated, a key advantage of the invention is achieved when the optical beam generator is thermally coupled to at least one of the conductive element pair so that a center wavelength of the optical beam is predeterminedly shifted in response to the temperature of the conductive element in contact with the beam generator. The optical beam produced by the beam generator is then demodulated into respective demodulated signals for measuring the sensed current and the temperature of the one conductive element. This demodulation step can be accomplished using a WDM 300 (FIGS. 4A and 4B) having a predetermined cutoff wavelength for selectively splitting the optical beam into a constituent beam pair in accordance with the wavelength shift of the optical beam with respect to the cutoff wavelength. The constituent beam pair is converted into a corresponding pair of electrical signals which can be further processed by DSP circuitry in order to obtain the temperature and sensed current measurements.

For the embodiment illustrated in FIG. 2, a method of sensing thermally induced errors may include some additional steps. In particular, once the temperature or temperature change of at least one of the conductive elements or even both of the conductive elements is measured, the temperature or temperature change measurement may be converted to a resistivity measurement and any change in resistivity due to the temperature change is then filtered from the voltage difference measurement based on the contact points to obtain the current flow measurement.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A current sensor comprising:

a conductive element pair for producing a voltage signal indicative of sensed current; and an electro-optical system for sensing signal changes due to thermally induced changes in said current sensor, said electro-optical system comprising:

means for digitizing said signal indicative of sensed current to produce a corresponding binary coded signal;

means coupled to the digitizing means for producing excitation pulses corresponding to a respective digital value of said binary coded signal;

means for generating an optical beam that is amplitude modulated in response to said excitation pulses such that said modulation is indicative of the sensed current, said beam generating means thermally coupled to at least one of said conductive element pair so that a center wavelength of said optical beam is predeterminedly shifted in response to the temperature of said at least one conductive element; and an electro-optics demodulator optically coupled to said beam generating means to receive said optical beam and adapted to demodulate said optical beam into respective demodulated signals for measuring the sensed current and the temperature of said at least one conductive element.

2. The current sensor of claim 1 wherein said beam generating means comprises a light emitting diode.

3. The current sensor of claim 1 wherein said beam generating means comprises a laser diode.

4. The current sensor of claim 1 wherein said electro-optics demodulator includes a wavelength division multiplexer (WDM) having a predetermined cutoff wavelength for operating on the optical beam received from the beam generating means.

5. The current sensor of claim 4 wherein said WDM comprises a dichroic filter positioned to receive said optical beam at a predetermined angle, said dichroic filter adapted to selectively split said received optical beam into a demodulated constituent beam pair emerging from said WDM along a respective one of first and second output axes in accordance with the center wavelength shift of said optical beam with respect to said cutoff wavelength.

6. The current sensor of claim 5 wherein said electro-optics demodulator further includes first and second photodetector elements positioned along said first and second output axes, respectively, to receive said demodulated constituent beam pair and to produce a corresponding pair of demodulated electrical signals, respectively.

7. The current sensor of claim 6 further comprising processing means for receiving the pair of demodulated electrical signals from said electro-optics demodulator to measure the sensed current and the temperature of said at least one conductive element in response to said electrical signal pair.

8. The current sensor of claim 5 further comprising an optical filter situated between said beam generating means and said WDM to filter predetermined spectral components of the optical beam passing therethrough.

9. The current sensor of claim 4 further comprising respective optical fiber means connected to said WDM for receiving said optical beam and for selectively supplying a demodulated beam pair in accordance with the center wavelength shift of said optical beam with respect to said cutoff wavelength.

10. In a current sensor having a conductive element pair for producing a voltage signal indicative of sensed current, an electro-optical system for sensing signal changes due to thermally induced changes in said current sensor, said electro-optical system comprising:

means for digitizing said signal indicative of sensed current to produce a corresponding binary coded signal;

means coupled to the digitizing means for producing excitation pulses corresponding to a respective digital value of said binary coded signal;

means for generating an optical beam that is amplitude modulated in response to said excitation pulses such that said modulation is indicative of the sensed current, said beam generating means thermally coupled to at least one of said conductive element pair so that a center wavelength of said optical beam is predeterminedly shifted in response to the temperature of said at least one conductive element; and an electro-optics demodulator optically coupled to said beam generating means to receive said optical beam and adapted to demodulate said optical beam into respective demodulated signals for measuring the sensed current and the temperature of said at least one conductive element.

11. The electro-optical system of claim 10 wherein said beam generating means comprises a light emitting diode.

12. The electro-optical system of claim 10 wherein said beam generating means comprises a laser diode.

13. The electro-optical system of claim 10 wherein said electro-optics demodulator includes a wavelength division multiplexer (WDM) having a predetermined cutoff wavelength for operating on the optical beam received from the beam generating means.

14. The electro-optical system of claim 13 wherein said WDM comprises a dichroic filter positioned to receive said optical beam at a predetermined angle, said dichroic filter adapted to selectively split said received optical beam into a demodulated constituent beam pair emerging from said WDM along a respective one of first and second output axes in accordance with the center wavelength shift of said optical beam with respect to said cutoff wavelength.

15. The electro-optical system of claim 14 wherein said electro-optics demodulator further includes first and second photodetector elements positioned along said first and second output axes, respectively, to receive said demodulated constituent beam pair and to produce a corresponding pair of demodulated electrical signals, respectively.

16. The electro-optical system of claim 15 further comprising processing means for receiving the pair of demodulated electrical signals from said electro-optics demodulator to measure the sensed current and the temperature of said at least one conductive element in response to said electrical signal pair.

17. The electro-optical system of claim 14 further comprising an optical filter situated between said beam generating means and said WDM to filter predetermined spectral components of the optical beam passing therethrough.

18. The electro-optical system of claim 13 further comprising respective optical fiber means connected to said WDM for receiving said optical beam and for selectively supplying a demodulated beam pair in accordance with the center wavelength shift of said optical beam with respect to said cutoff wavelength.

19. A method for sensing and avoiding thermally induced changes in a voltage signal indicative of sensed current, said current being sensed with a current sensor having a pair of conductive elements, said method comprising the steps:

convening said signal indicative of sensed current into a corresponding binary coded signal;

producing excitation pulses corresponding to a respective digital value of said binary coded signal;

applying said excitation pulses to an optical beam generator to generate an optical beam having its amplitude modulated in response to said excitation pulses, said beam generator being thermally coupled to at least one of said conductive element pair so that a center wavelength of said optical beam is predeterminedly shifted in response to temperature of said at least one conductive element; and demodulating said optical beam into respective demodulated signals for measuring the sensed current and the temperature of said at least one conductive element.

20. The method of claim 19 wherein the demodulating step comprises selectively splitting said optical beam into a constituent demodulated beam pair in accordance with the wavelength shift of said optical beam with respect to a cutoff wavelength of a wavelength division multiplexer (WDM).

21. The method of claim 20 wherein the demodulating step further comprises converting said demodulated constituent beam pair into a corresponding pair of demodulated electrical signals.

22. The method of claim 21 further comprising the steps of converting said pair of demodulated electrical signals to a sensed current measurement and to a temperature measurement;

converting the temperature measurement to a resistivity measurement; and filtering any change in resistivity due to temperature from the sensed current measurement so as to remove thermally induced errors from the sensed current measurement.

\* \* \* \* \*